(12) United States Patent
Chen

(10) Patent No.: US 11,849,548 B2
(45) Date of Patent: Dec. 19, 2023

(54) POWER SUPPLY STRUCTURE OF ELECTRIC GRINDING TOOL MACHINE

(71) Applicant: X'POLE PRECISION TOOLS INC., Taoyuan (TW)

(72) Inventor: Bach Pangho Chen, Claremont, CA (US)

(73) Assignee: X'POLE PRECISION TOOLS INC., Taoyuan (TW)

( * ) Notice: Subject to any disclaimer, the term of this patent is extended or adjusted under 35 U.S.C. 154(b) by 617 days.

(21) Appl. No.: 16/926,153

(22) Filed: Jul. 10, 2020

(65) Prior Publication Data

US 2022/0015247 A1 Jan. 13, 2022

(51) Int. Cl.

| | |
|---|---|
| H05K 5/00 | (2006.01) |
| B24B 23/02 | (2006.01) |
| H02J 7/00 | (2006.01) |
| B24B 47/12 | (2006.01) |
| B24B 23/00 | (2006.01) |
| B25F 5/02 | (2006.01) |
| H01M 50/209 | (2021.01) |

(52) U.S. Cl.
CPC ......... *H05K 5/0086* (2013.01); *B24B 23/005* (2013.01); *B24B 23/028* (2013.01); *B24B 47/12* (2013.01); *B25F 5/02* (2013.01); *H02J 7/0044* (2013.01); *H02J 7/0045* (2013.01); *H02J 7/0063* (2013.01); *H01M 50/209* (2021.01); *H01M 2220/30* (2013.01)

(58) Field of Classification Search
CPC .............................. H05K 5/0086; H02J 7/0044
USPC ........................................................ 320/107
See application file for complete search history.

(56) References Cited

U.S. PATENT DOCUMENTS

| | | | |
|---|---|---|---|
| 6,840,335 B1 | 1/2005 | Wu | |
| 2006/0119318 A1* | 6/2006 | Serdynski | H01M 50/574 |
| | | | 320/114 |
| 2014/0131059 A1 | 5/2014 | Verbrugge et al. | |
| 2016/0325391 A1* | 11/2016 | Stampfl | H04Q 9/00 |
| 2021/0336396 A1* | 10/2021 | Gilde | H02J 7/0042 |
| 2022/0173559 A1* | 6/2022 | Naimo | H02J 7/0045 |

FOREIGN PATENT DOCUMENTS

WO   WO2019002125 A1   1/2019

* cited by examiner

*Primary Examiner* — Suchin Parihar
(74) *Attorney, Agent, or Firm* — Muncy, Geissler, Olds & Lowe, P.C.

(57) ABSTRACT

A power supply structure of an electric grinding tool machine comprises a power management module, a power connecting wire and a battery socket, wherein the power management module is arranged on a main body of the electric grinding tool machine, the power connecting wire is electrically connected with the power management module and extends outside the main body of the electric grinding tool machine, and the battery socket is connected with the power connecting wire and can be randomly changed in position on the basis of the power connecting wire, the battery socket being used for a replaceable battery which is selectively arranged on the battery socket, and the battery socket being provided with a guide chute formed corresponding to a boss on the replaceable battery in shape and at least two conductive terminals arranged in the guide chute.

16 Claims, 15 Drawing Sheets

POWER SUPPLY STRUCTURE OF ELECTRIC GRINDING TOOL MACHINE

FIELD OF THE INVENTION

The invention relates to a power supply structure, in particular to a power supply structure of an electric grinding tool machine.

BACKGROUND OF THE INVENTION

As brushless motors and lithium ion batteries continue to advance, traditional corded hand held tools are increasingly replaced by battery powered tools. However, most battery powered tools such as electric drills, electric screwdrivers, electric saws and the like are used intermittently, or the power consumption of the tool machines is small, thus, the battery thereof is sufficient to supply the power required by the tool machines. However, there are tools such as a grinder or a waxing machine, which use a large amount of electricity and are used continuously for a long time, and these kinds of tool machines require a long time and a large amount of power, and it is difficult for existing batteries to meet the power requirements of the tool machines.

In order to change a corded tool machine such as the grinder to be battery powered, it is necessary to use a large-capacity battery which is bulky and heavy. In addition, currently, the hand-held tool machine is mostly provided with a battery slot on which a battery can be arranged, and for a grinder, the grinder has significant weight per se. After the grinder is powered in a battery mode, the battery slot and the large-capacity battery are additionally arranged on the structure, so that the weight of the grinder is further increased.

Taking FIG. 1 as an example, FIG. 1 depicts a grinding tool machine 300 of model CS-1841 from Demos Tool Industrial Co., Ltd., the grinding tool machine 300 comprises a body-mounted grinder pad 301, a battery slot 302 mounted on a tail end of the main body, and a replaceable battery attached to the battery slot 302. As compared with the conventional corded tool machine, the grinding tool machine 300 is additionally provided with the battery slot 302 and the replaceable battery 303 at the tail end of the main body, thereby enabling the grinding tool machine 300 to use the replaceable battery 303 as a power source. However, when the grinding tool machine 300 is used, due to the significant weight of the battery slot 302 and the replaceable battery 303, a user needs to lift the grinding tool machine 300 with more effort when operating the grinding tool machine 300, which makes the grinding position difficult to control and tends to cause unstable grinding quality. Furthermore, when the battery slot 302 and the replaceable battery 303 are attached to the grinding tool machine 300, the overall weight of the grinding tool machine 300 is greatly increased, such that it is difficult for a user to hold the grinding tool machine 300 for a long time, and the user is easier to suffer work damage after holding the grinding tool machine 300 for a long time.

In addition, with respect to a polishing tool machine 400 depicted in FIG. 2, the polishing tool machine 400 is a tool machine of Model T01DP202B from ETQ Corporation, the polishing tool machine 400 comprises a polishing pad 401 at the polishing tool machine 400, and a battery slot 402 is formed at a top end to provide for a replaceable battery 403 being attached thereto, such that a balance weight of the polishing tool machine 400 is concentrated on a top of the polishing tool machine 400. When a user operates the polishing tool machine 400, the polishing tool machine 400 is stably displaced when the user holds the main body of the polishing tool machine 400 with one hand and holds a grip 404 of the polishing tool machine 400 with another hand, and it is considered that this type of tool machine is still inconvenient for the user to operate.

Further, taking FIG. 3 as an example, a grinding tool machine 500 is a tool machine of model GWS 18V-100 SC from BOSCH GmbH, the grinding tool machine 500 has a grinding disc 501, a battery slot 502, and a replaceable battery 503, wherein the grinding disc 501 is mounted on a main body for grinding, the battery slot 502 is arranged at a tail end of the main body of the grinding tool machine 500, and the replaceable battery 503 is attached to the battery slot 502 to be disposed at the tail end of the main body of the grinding tool machine 500. There is a problem that the weight is not balanced when using the grinding tool machine 500 of the present type, and causing the user to apply more force to a head of the grinding tool machine 500 while operating the grinding tool machine 500 to balance the weights of two ends of the grinding tool machine 500, thereby the grinding force is difficult to control and causing a problem of poor grinding quality. Furthermore, in order to balance the weight of the grinding tool machine 500, the grinding tool machine 500 is additionally provided with a grip 504 at the head of the grinding tool machine 500 to assist the user in holding the grinding tool machine 500 and simultaneously increasing the grinding quality. Furthermore, the grinding tool machine 500 of the present type also has a problem of being excessively heavy and is difficult for the user to hold for a long time.

SUMMARY OF THE INVENTION

The main purpose of the present invention is to solve the problems of difficulty in operation and the like when a conventional grinder is changed to be battery powered.

In order to achieve the object, the invention provides a power supply structure of an electric grinding tool machine comprising a power management module, arranged on a main body of the electric grinding tool machine, a power connecting wire electrically connected with the power management module and extending outside the main body of the electric grinding tool machine, and a battery socket connected with the power connecting wire and being able to be randomly changed in position on a basis of the power connecting wire, the battery socket being used for a replaceable battery which is selectively arranged on the battery socket, and the battery socket being provided with a guide chute formed corresponding to a boss on the replaceable battery in shape and at least two conductive terminals arranged in the guide chute.

In an embodiment, the power management module comprises a first connecting seat arranged on an outer surface of the main body of the electric grinding tool machine, and one end of the power connecting wire which is not connected with the battery socket comprises a first connector capable of being connected with the first connecting seat.

In an embodiment, one end of the power connecting wire which is connected with the battery socket comprises a second connector, and the battery socket is provided with a second connecting seat capable of being connected with the second connector.

In an embodiment, the guide chute has an inlet end and a tail end, the at least two conductive terminals are arranged near the tail end, and the guide chute is further provided with a barrier at the inlet end.

In an embodiment, the battery socket comprises a base for disposing the two conductive terminals, and at least one electric lead connected with the two conductive terminals is arranged in the base.

In an embodiment, the two conductive terminals are horizontally spaced apart, and the two conductive terminals are both plate-shaped.

In an embodiment, a side of the battery socket where the guide chute is not formed comprises a hanging lug.

In an embodiment, a side of the battery socket where the guide chute is not formed comprises a snap ring.

In an embodiment, the battery socket matched for use with the power supply structure is selected on a basis of a shape of the boss of the replaceable battery.

Through the abovementioned implementation of the invention, compared with the prior art, the invention has the following characteristics: by changing the power supply structure of the electric grinding tool machine, the battery socket can be arranged at any position on the basis of the power connecting wire, so that when the replaceable battery is attached to the battery socket, the counterweight of the electric grinding tool machine can be changed, a user can hold the main body of the electric grinding tool machine, and the weight borne by the hand can be greatly reduced. Therefore, the optimal working quality can be easily achieved when the grinding operation is used, and meanwhile, the work injury can be avoided.

DETAILED DESCRIPTION OF THE PREFERRED EMBODIMENTS

Figure 1:
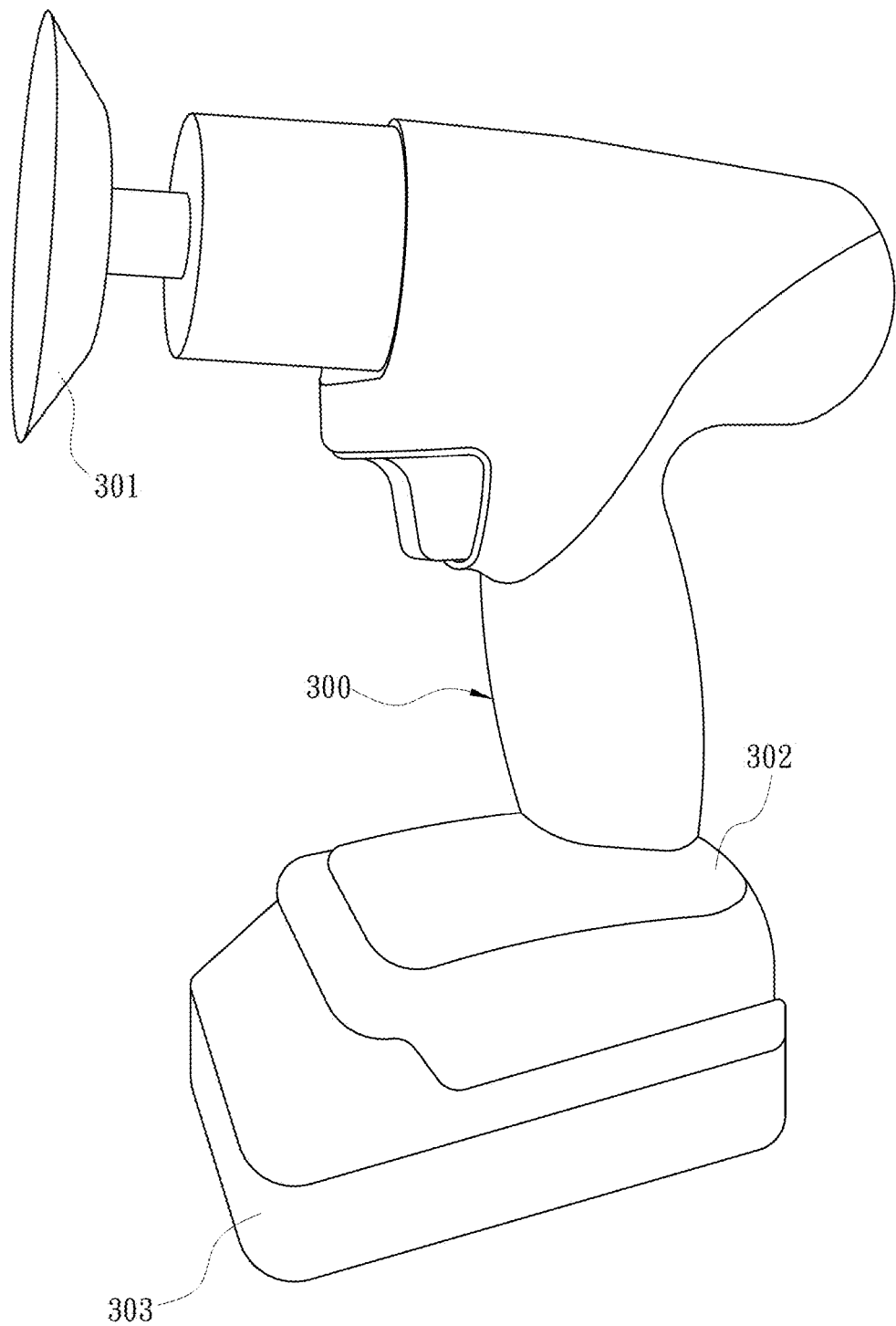
FIG. 1. is a schematic diagram of a conventional battery powered tool machine.
Figure 2:
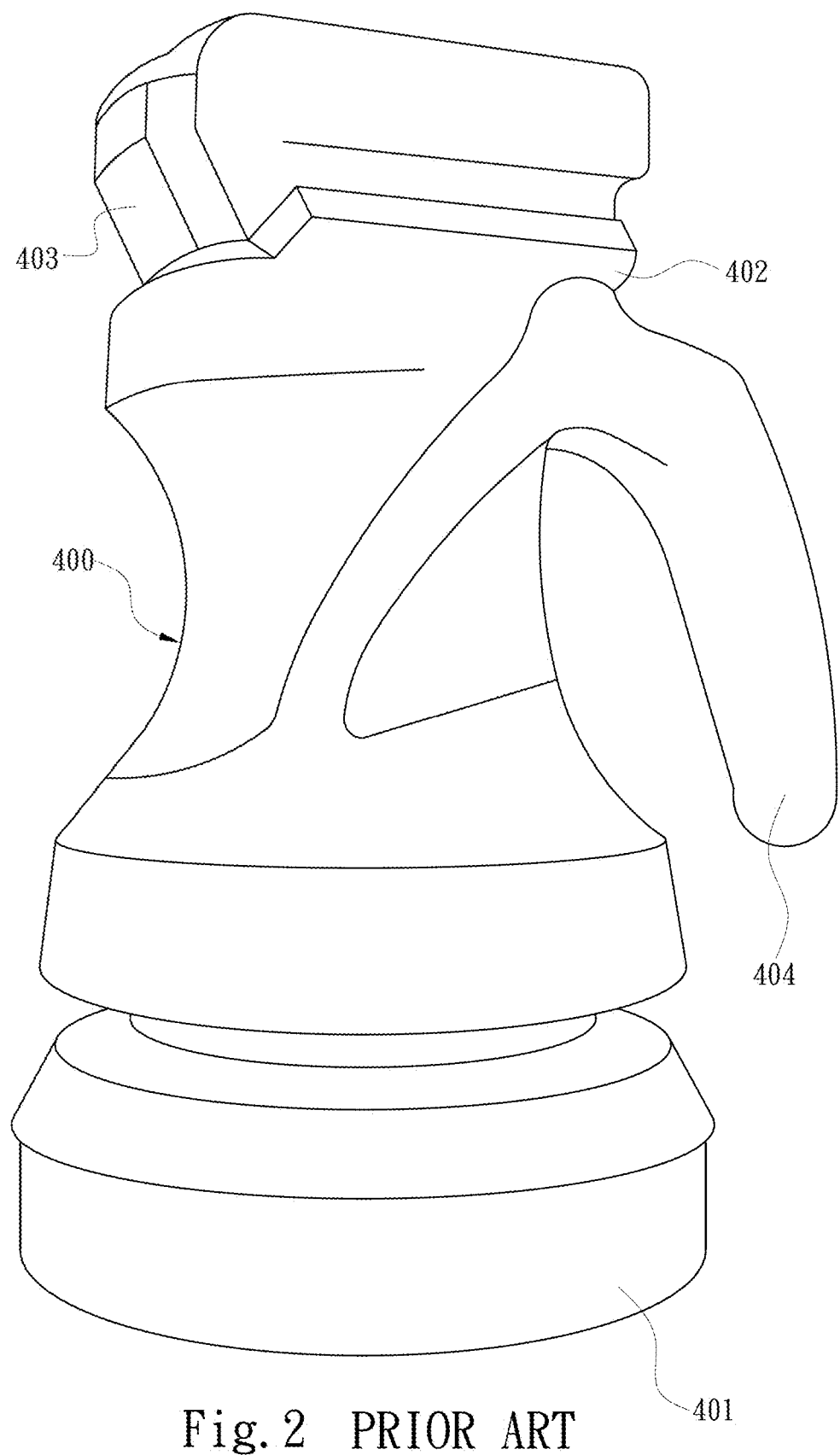
FIG. 2. is a schematic diagram of a conventional battery powered tool machine.
Figure 3:
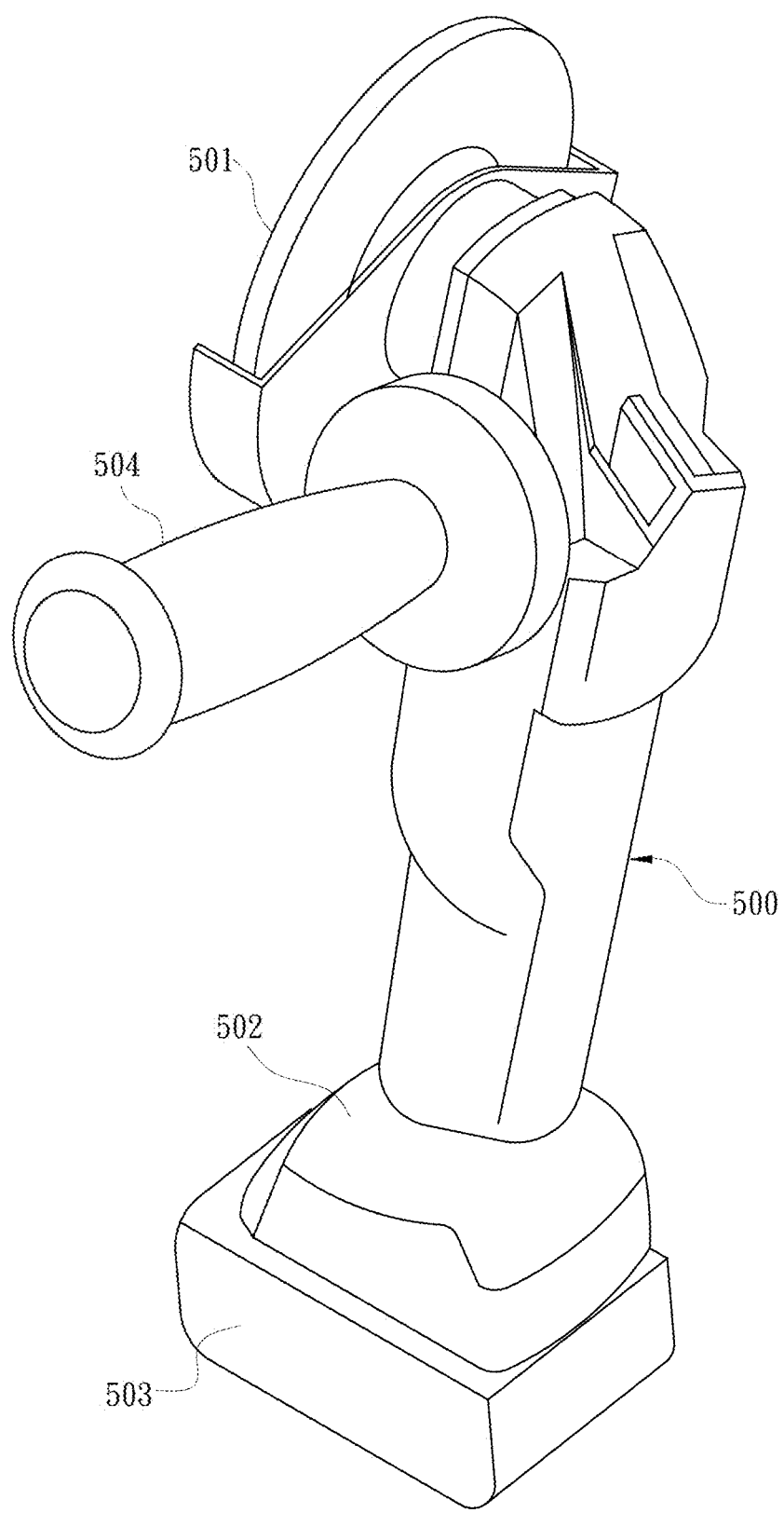
FIG. 3. is a schematic diagram of a conventional battery powered tool machine.
Figure 4:
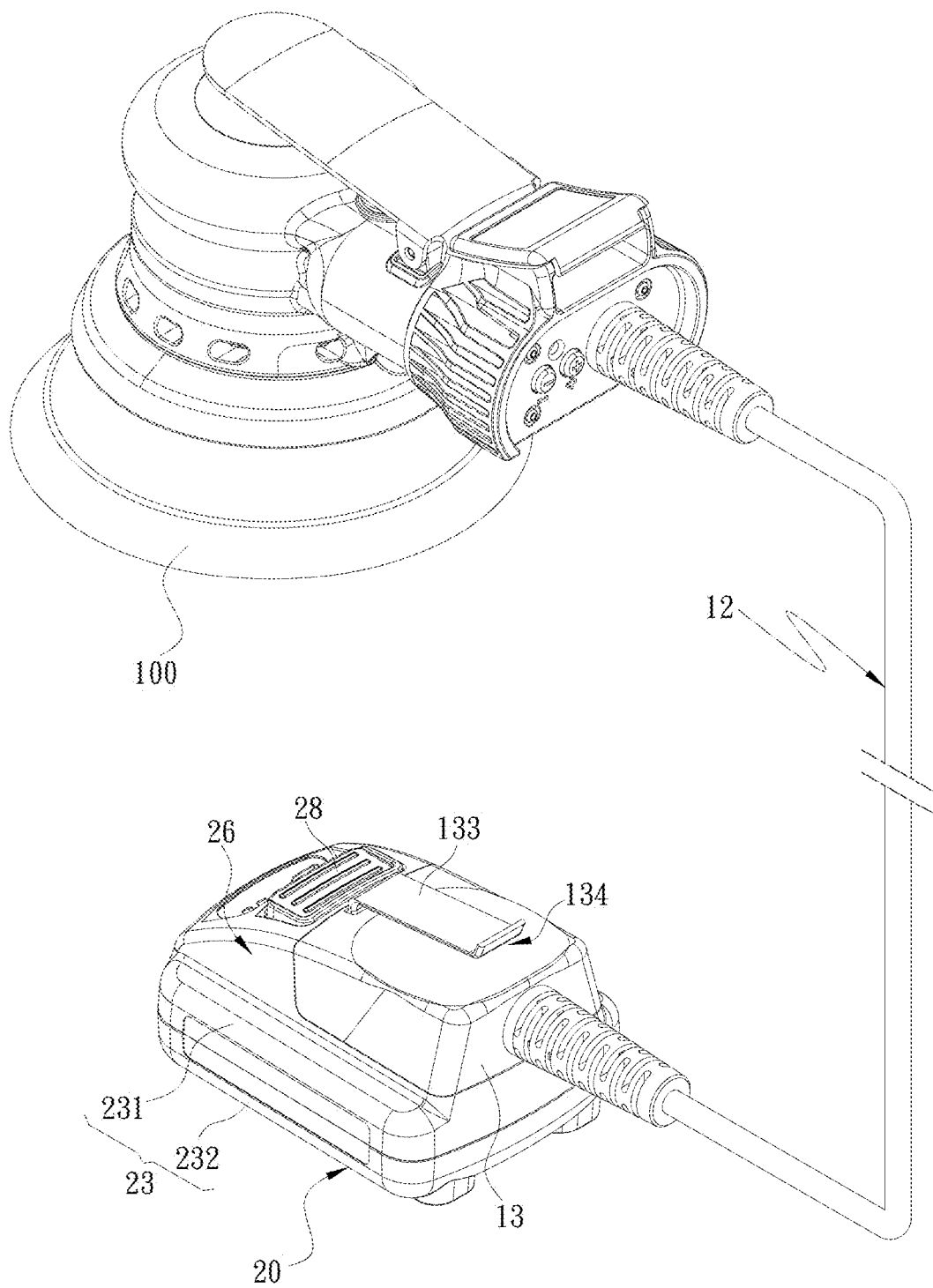
FIG. 4 is a schematic diagram of a three-dimensional structure of an embodiment of the present invention.
Figure 5:
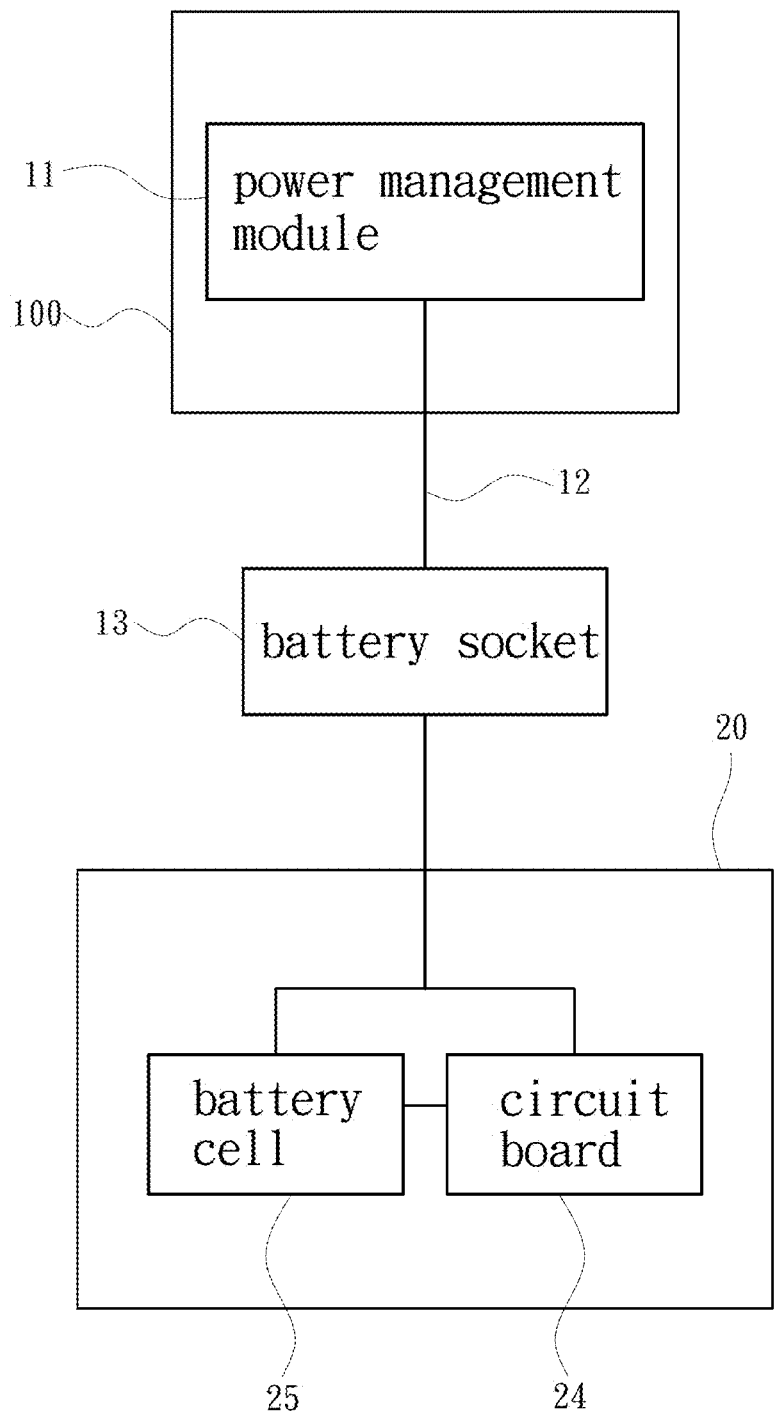
FIG. 5 is a block diagram of an embodiment of the present invention.
Figure 6:
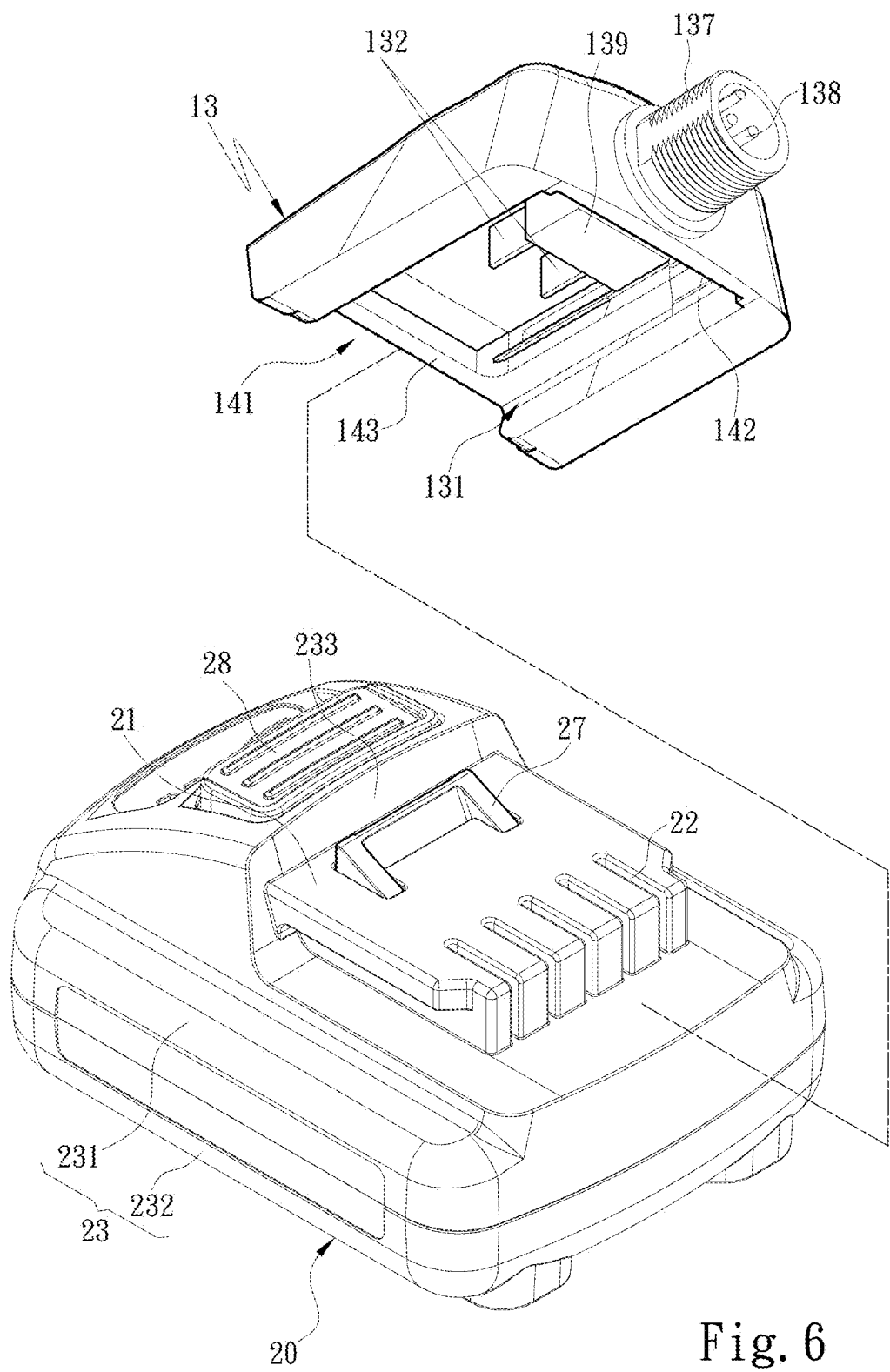
FIG. 6 is an exploded schematic diagram of partial structure of an embodiment of the present invention.
Figure 7:
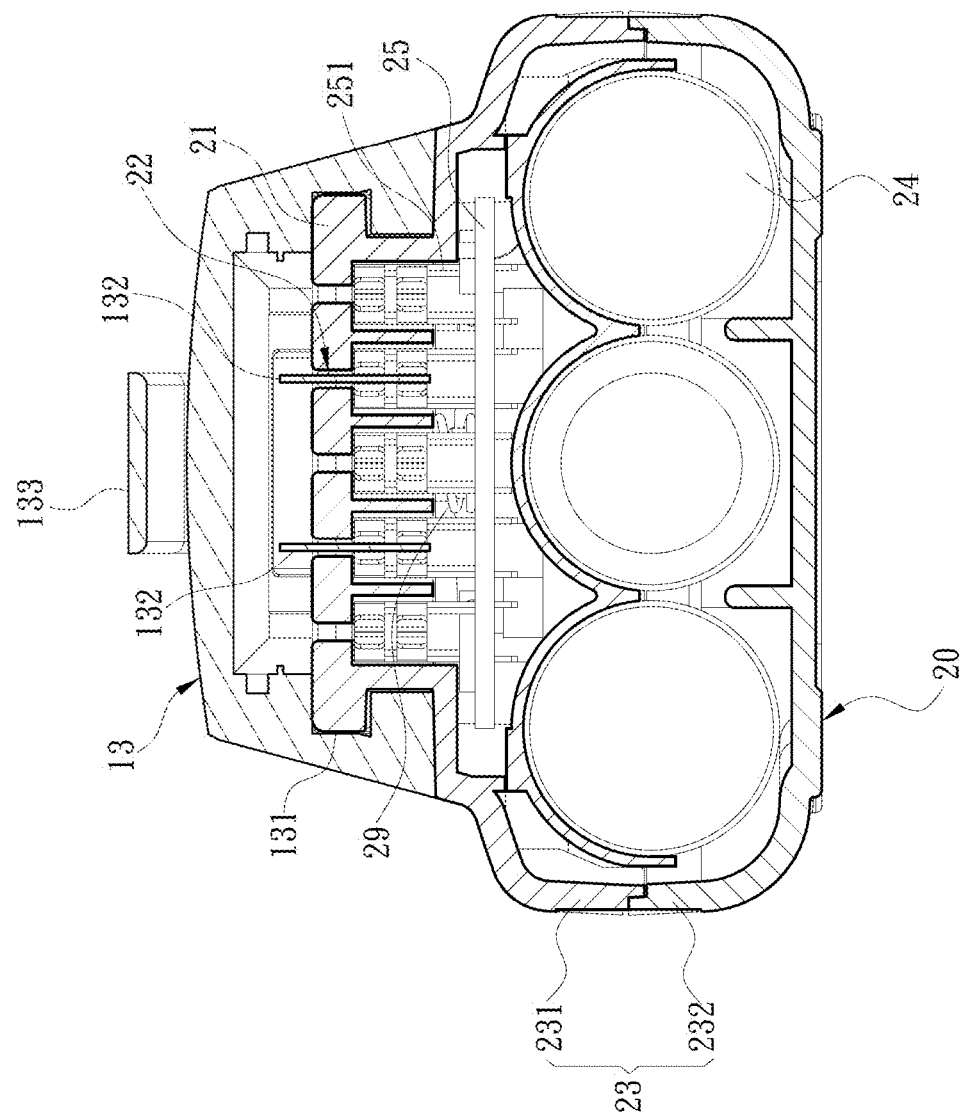
FIG. 7 is a cross-sectional schematic diagram of partial structure of an embodiment of the present invention.

The detailed description and technical contents of the present invention will now be described with reference to the drawings as follows:

With reference to FIGS. 4, 5, and 6, the present invention provides a power supply structure of an electric grinding tool machine 100. First, it is explained that the electric grinding tool machine 100 of the present invention can be a battery powered tool machine, and the electric grinding tool machine 100 is a tool machine which requires a long-term continuous operation. Further, the electric grinding tool machine 100 of the present invention changes the power supply structure of the electric grinding tool machine 100, when the electric grinding tool machine 100 is changed with a replaceable battery 20 as a power source, the replaceable battery 20 is not directly attached to a main body of the electric grinding tool machine 100, so that a counterweight of the electric grinding tool machine 100 is not generated at one end of the main body of the electric grinding tool machine 100.

Specifically, with reference to FIGS. 4, 5, 6, and 7, the power supply structure of the present invention includes a power management module 11, a power connecting wire 12, and a battery socket 13. Specifically, the power management module 11 is provided on the main body of the electric grinding tool machine 100, and the power management module 11 is composed of a plurality of electronic components for receiving power and controlling an operation of the electric grinding tool machine 100 to perform a grinding operation after the electric grinding tool machine 100 is turned on. The power connecting wire 12 is electrically connected with the power management module 11, the power connecting wire 12 extends out of the main body of the electric grinding tool machine 100, and the power connecting wire 12 is used for transmitting power to the power management module 11.

Figure 11:
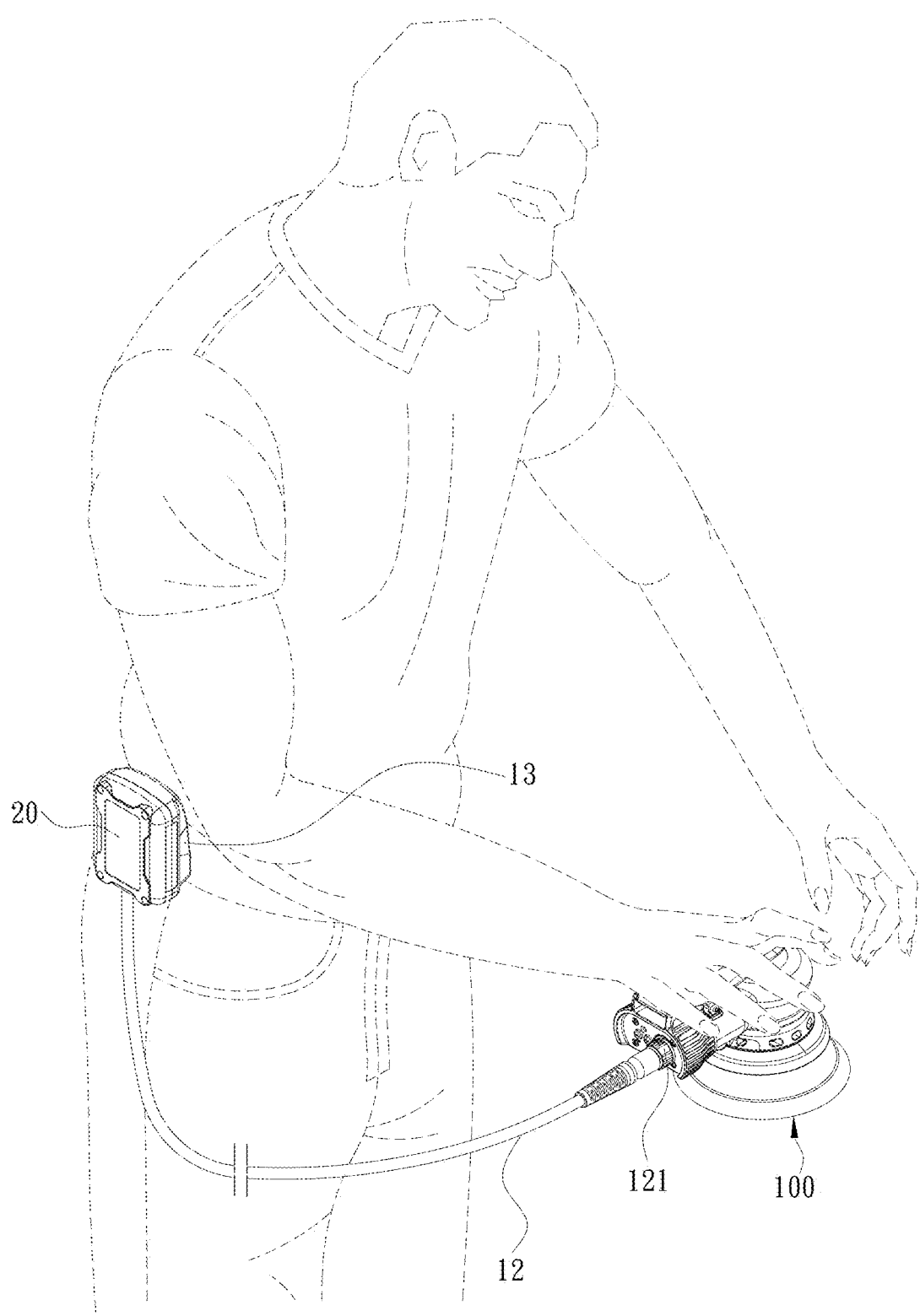
FIG. 11 is a schematic diagram of a battery socket and a replaceable battery which are carried by a user of an embodiment of the present invention.

Further, the battery socket 13 is connected with the other end of the power connecting wire 12 without being provided on the main body of the electric grinding tool machine 100. That is, the battery socket 13 and the electric grinding tool machine 100 of the present invention are of a separate design. When the battery socket 13 is provided with the replaceable battery 20, the counterweight of the electric grinding tool machine 100 is not concentrated on the main body of the electric grinding tool machine 100, so that the weight on a user holding the electric grinding tool machine 100 can be reduced. Further, the battery socket 13 may be arbitrarily changed in position on the basis of the power connecting wire 12, so that a place range of the replaceable battery 20 is determined on the basis of a length of the power connecting wire 12. For example, the battery socket 13 may be hung on a trouser as depicted in FIG. 11 or placed in a work case which the user hangs on the waist as permitted by the length condition of the power connecting wire 12. Further, a specification of the replaceable battery 20 used in the present invention is implemented in accordance with a battery of a conventional battery powered tool, and the power supply manner of the replaceable battery 20 can be powered as disclosed in WO2019002125A, US 2014/0131059A, U.S. Pat. No. 6,840,335B, etc. In one embodiment, the replaceable battery 20 of the present invention may supply power between 18 volts and 24 volts, such as 18 volts, 19.2 volts, 20 volts, 21.6 volts, or 24 volts, and the power management module 11 of the present invention manages the power provided by the replaceable battery 20 which has various voltages, in order to maintain stable operation of the electric grinding tool machine 100. Stable operation means that the electric grinding tool machine 100 does not change a rated rotation speed of the electric grinding tool machine 100 due to different voltages supplied from the replaceable battery 20. In one embodiment, the power management module 11 may be designed to drive a driving assembly (e.g., a brushless motor, not shown) arranged within the electric grinding tool machine 100 at a fixed operating voltage (e.g., 18 volts). If a voltage of the power drawn by the power management module 11 from the replaceable battery 20 is greater than the operating voltage, the driving assembly will not be driven by the voltage of the power supplied by the replaceable battery 20, and the driving assembly is still maintained to be driven at the operating voltage.

Again with reference to FIGS. 6, 7, 8, 9, and 10, on the other hand, the replaceable battery 20 includes a boss 21 protruding toward the battery socket 13 and a plurality of conductive holes 22 formed in the boss 21. Furthermore, the battery socket 13 of the present invention is electrically connected with the replaceable battery 20. Meanwhile, in order to stably assemble the replaceable battery 20, the battery socket 13 is provided with a guide chute 131 and at least two conductive terminals 132, wherein a shape of the guide chute 131 is formed corresponding to the boss 21. The guide chute 131 guides the battery socket 13 to be assembled with the replaceable battery 20 during assembly, and thereby limits an assembly position of the battery socket 13 and the replaceable battery 20. In addition, the two conductive terminals 132 are arranged in the guide chute 131, and polarities of the two conductive terminals 132 are opposite. In an embodiment, with reference to FIG. 4, the two conductive terminals 132 are both plate-shaped, and the two conductive terminals 132 are horizontally spaced apart, such that after the battery socket 13 and the replaceable battery 20 are assembled, the two conductive terminals 132 are respectively assembled to one of the conductive holes 22 in the replaceable battery 20. The battery socket 13 is enabled to receive the power of the replaceable battery 20, and then the battery socket 13 transmits the power of the replaceable battery 20 to the power connecting wire 12.

In the present invention, by changing the power supply structure of an electric grinding tool machine 100, the battery socket 13 can be arranged at any position on the basis of the power connecting wire 12, so that when the replaceable battery 20 is attached to the battery socket 13, the counterweight of the electric grinding tool machine 100 can be changed. Therefore, a user can hold the main body of the electric grinding tool machine 100, and the weight borne by the hand can be greatly reduced. Therefore, an optimal working quality of the grinding operation can be easily achieved, and meanwhile the work injury can be avoided.

Figure 12:
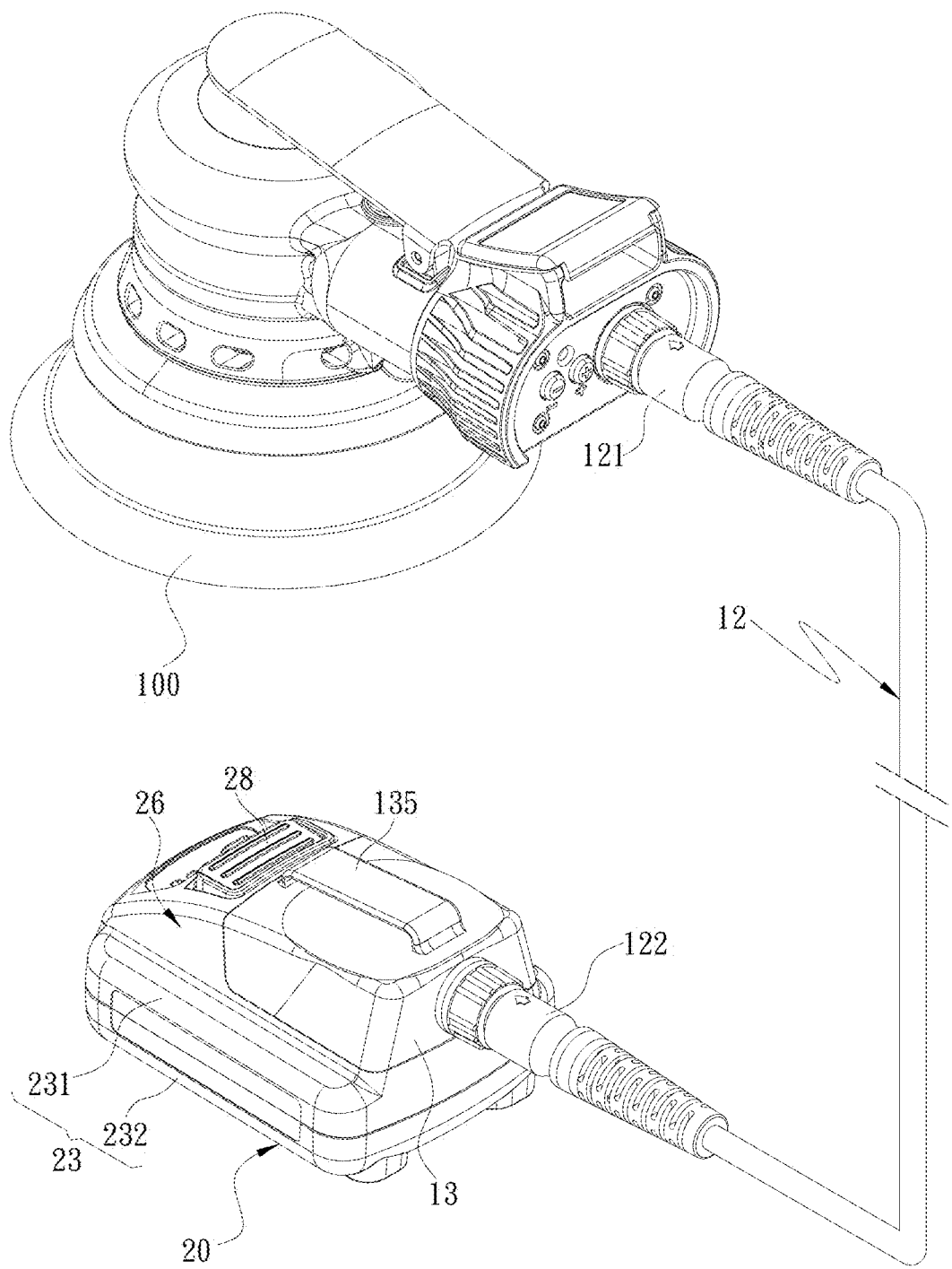
FIG. 12 is a schematic diagram of a power connecting wire having a connector of an embodiment of the present invention.

Again with reference to FIG. 4, in one embodiment of the present invention, the battery socket 13 and the replaceable battery 20 can be carried by a user, and a hanging lug 133 is provided on a side of the battery socket 13 where the guide chute 131 is not formed, and the hanging lug 133 includes a free end 134 at the end which does not face the power connecting wire 12 for hanging by a user. In another embodiment, with reference to FIG. 12, the battery socket 13 may also be provided with a snap ring 135 arranged at a location of the hanging lug 133, i.e., the snap ring 135 being on the side of the battery socket 13 where the guide chute 131 is not formed, the snap ring 135 allowing a user to hang the battery socket 13 and the replaceable battery 20.

Figure 10:
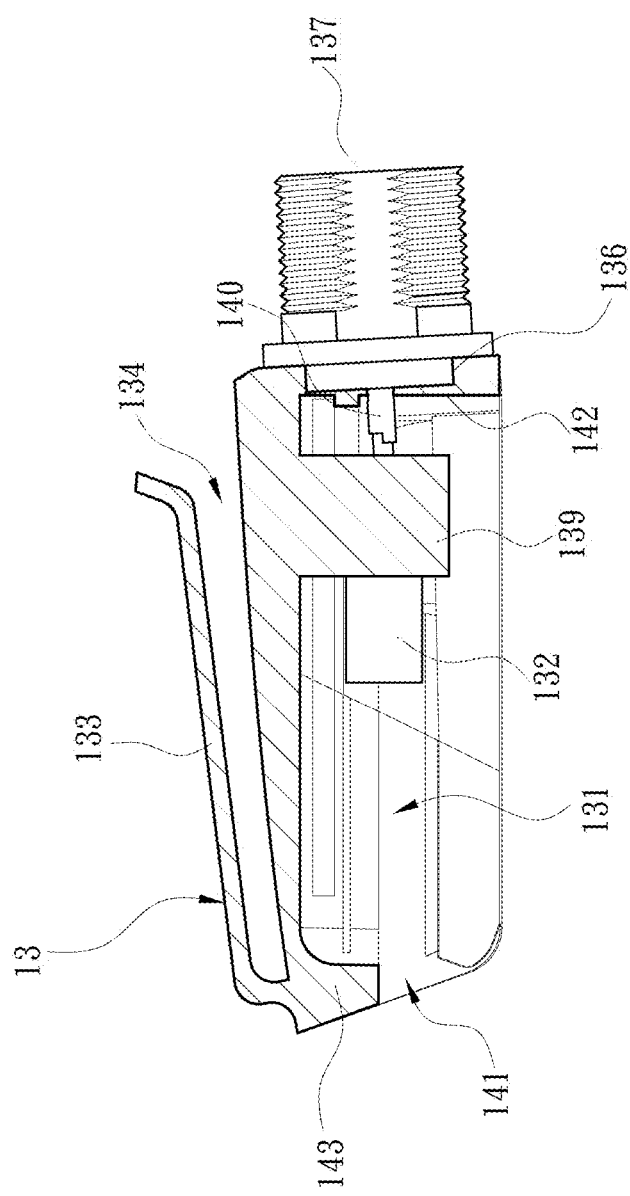
FIG. 10 is a cross-sectional schematic diagram of a battery socket structure of an embodiment of the present invention.
Figure 13:
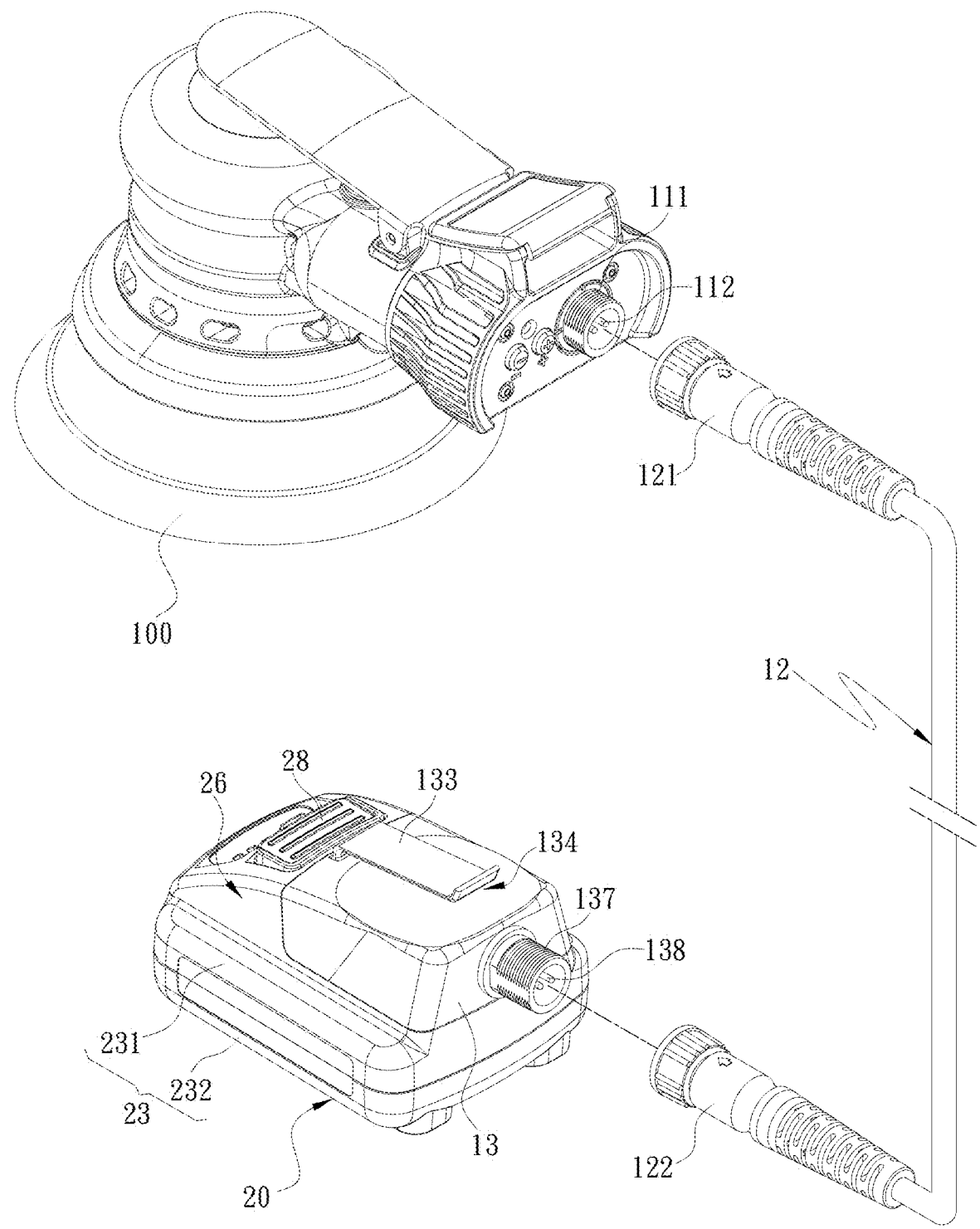
FIG. 13 is a schematic diagram showing the separation of a power connecting wire from a connecting seat of an embodiment of the present invention.

On the other hand, with reference to FIGS. 5, 10 and 13, in one embodiment, the power connecting wire 12 of the present invention is detachable with respect to the power management module 11 and the battery socket 13. To be specifically explained, the power management module 11 includes a first connecting seat 111 provided on an outer surface of the electric grinding tool machine 100, the power connecting wire 12 includes a first connector 121 located at an end of the power connecting wire 12 which is not connected to the battery socket 13 so as to be able to be connected with the first connecting seat 111. In one embodiment, the first connecting seat 111 includes at least one first pin 112 arranged therein, which is electrically connected with the power management module 11 and is used to connect the power connecting wire 12. Further, the power connecting wire 12 further has a second connector 122 at an end of the power connecting wire 12 not provided with the first connector 121, the second connector 122 is used for being connected with the battery socket 13, the battery socket 13 is connected with the second connector 122, the battery socket 13 is formed with a open 136 and a second connecting seat 137 arranged on the open 136, the second connecting seat 137 being used for being assembled with the second connector 122. In one embodiment, the second connecting seat 137 includes at least one second pin 138 arranged therein, the second pin 138 being electrically connected with the two conductive terminals 132, and the second pin 138 being connected with the second connector 122, thereby transferring power from the two conductive terminals 132 to the second connector 122.

In an embodiment, the battery socket 13 is provided with a base 139 arranged in the guide chute 131, the base 139 is used for disposing the two conductive terminals 132, at least one electric lead 140 is arranged in the base 139, the electric lead 140 is connected with the two conductive terminals 132, and the electric lead 140 is electrically connected with the second pin 138, so that the electric lead 140 transmits the two conductive terminals 132 to the power connecting wire 12.

On the other hand, with reference to FIGS. 6, 7, 8, 9, and 10, in one embodiment, the guide chute 131 of the present invention includes an inlet end 141 and a tail end 142, the inlet end 141 is an open end for the replaceable battery 20 to enter the guide chute 131 therethrough, and the tail end 142 is a closed end. The two conductive terminals 132 are arranged in the guide chute 131 near the tail end 142. Further, it can be seen from the replaceable battery 20 as presently disclosed, the replaceable battery 20 includes a housing 23, a battery cell 24 arranged within the housing 23, and a circuit board 25 arranged within the housing 23. To be specifically explained, the housing 23 is composed of at least an upper cover 231 and a bottom housing 232, and the electronic components of the replaceable battery 20 are provided inside on the housing 23. The housing 23 is formed with a stop surface 233 facing the inlet end 141, and the stop surface 233 is used for stopping the replaceable battery 20, thereby positioning the guide chute 131. Further, after the replaceable battery 20 is assembled with the battery socket 13, an outer surface of the replaceable battery 20 and the outer surface of the battery socket 13 will form a continuous plane 26 (as shown in FIG. 4). In addition, the battery cell 24 is covered by the housing 23, and the battery cell 24 is used for providing power required by the replaceable battery 20. In one embodiment, the battery cell 24 used in the present invention may be a rechargeable battery with models such as 18650, 26650, or 14500. Furthermore, the circuit board 25 is also provided in the housing 23, and the circuit board 25 is electrically connected with the battery cell 24, and the circuit board 25 is used for controlling the battery cell 24. In one embodiment, the circuit board 25 is provided with at least one connection terminal 251 electrically connected with the battery cell 24, and the connection terminal 251 provides power from the battery cell 24 to the two conductive terminals 132.

Figure 8:
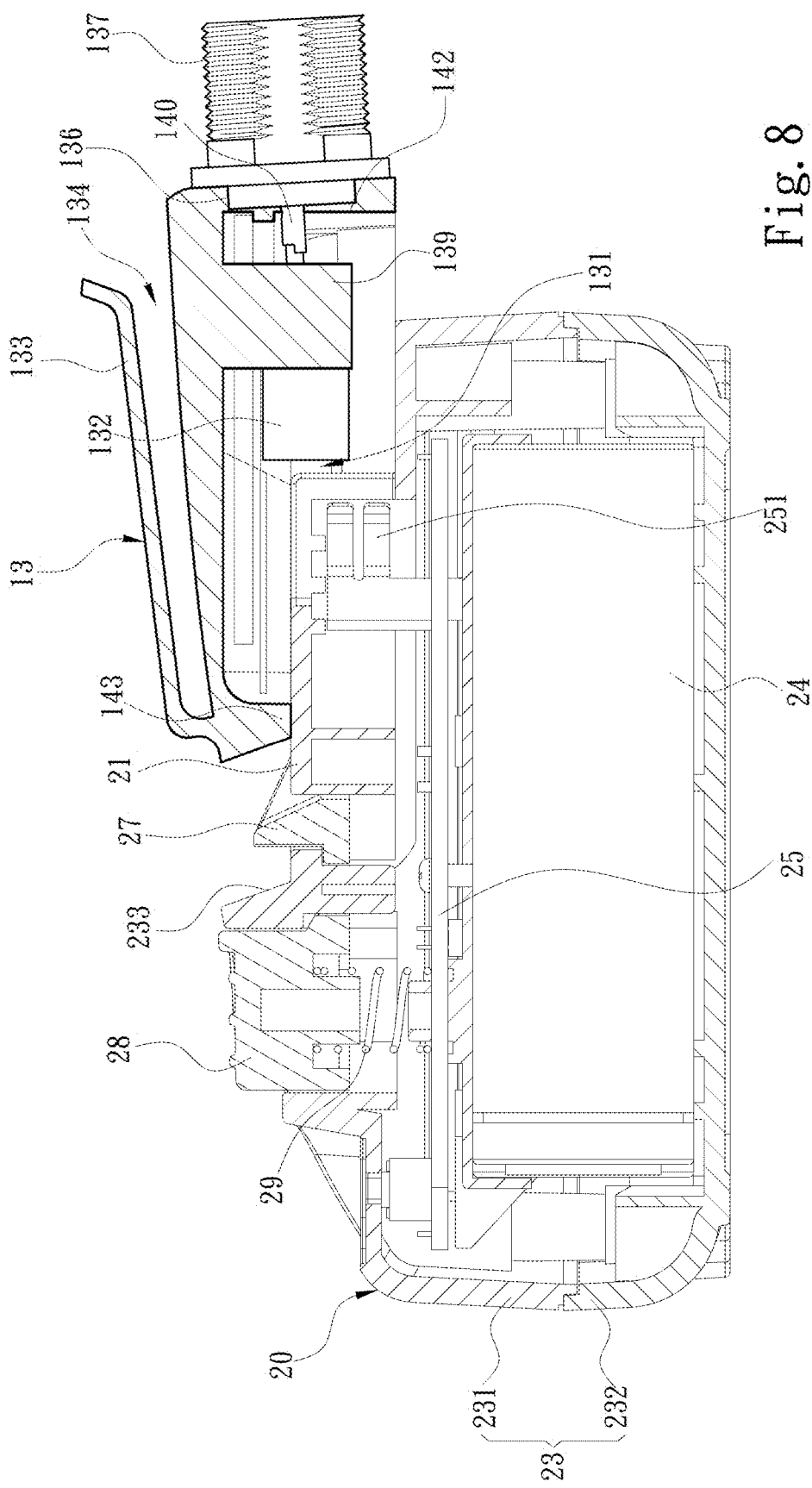
FIG. 8 is a cross-sectional schematic diagram of partial structure of an embodiment of the present invention.
Figure 9:
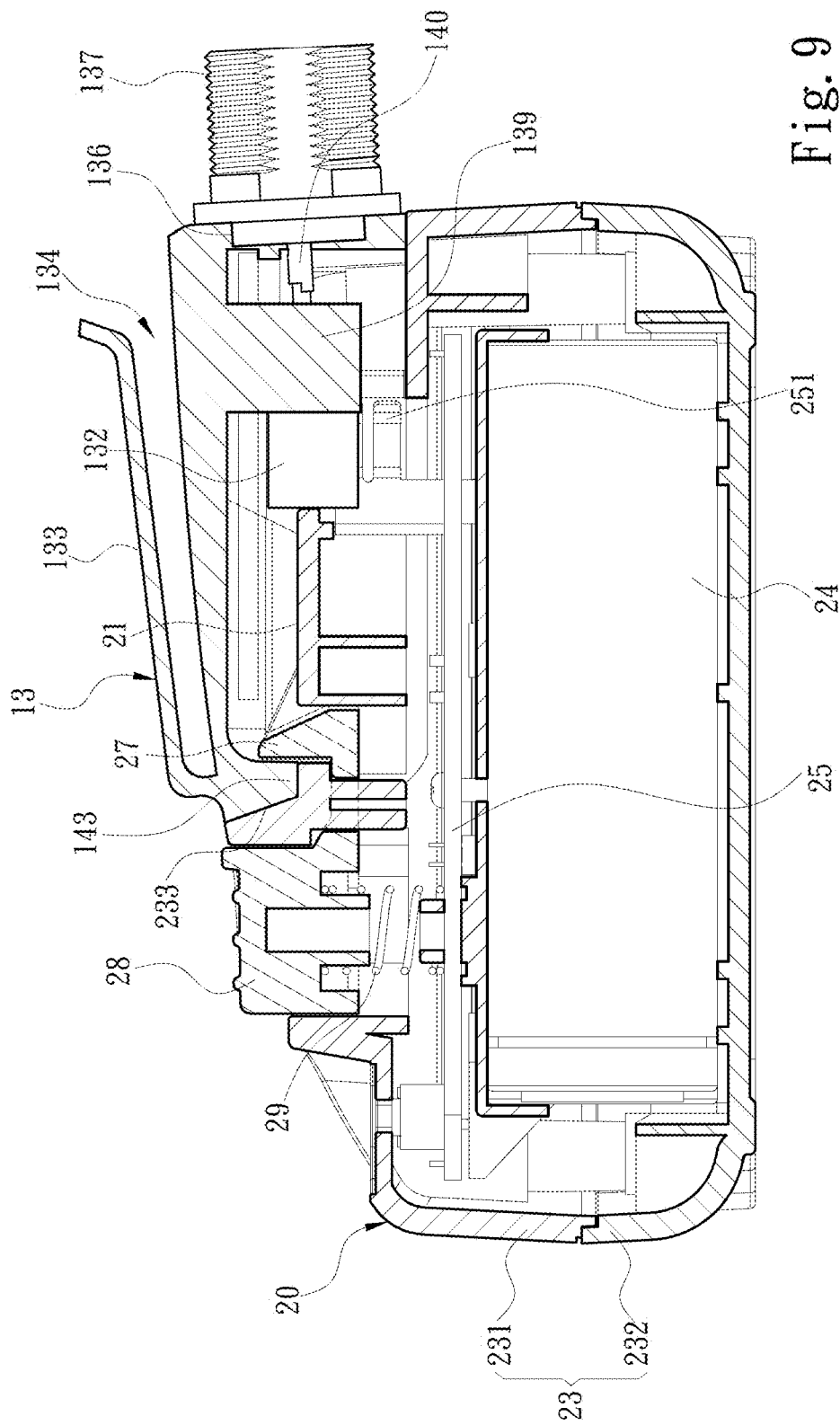
FIG. 9 is a cross-sectional schematic diagram of partial structure of an embodiment of the present invention.

Accordingly, with reference to FIGS. 8, 9, and 10, in one embodiment, the replaceable battery 20 includes a limit structure 27 provided on the housing 23 and an operating member 28 connected to the limit structure 27, and the guide chute 131 includes a barrier 143 matched with the limit structure 27. Specifically, the barrier 143 is located at the inlet end 141 of the guide chute 131, and the limit structure 27 protrudes towards a direction facing the barrier 143, so that the battery socket 13 and the replaceable battery 20 cannot be separated from each other when the barrier 143 is limited by the limit structure 27. The operating member 28 is used for controlling whether the limit structure 27 releases the limitation on the battery socket 13 or not. When the operating member 28 is not operated, the limit structure 27 does not release the limitation on the battery socket 13, so that the battery socket 13 cannot be detached from the replaceable battery 20. When the operating member 28 is operated, the limit structure 27 releases the limitation on the battery socket 13 so that the battery socket 13 can be released. In one embodiment, the replaceable battery 20 further includes a spring 29 arranged on the housing 23, the spring 29 is connected with the operating member 28, and the spring 29 provides a restoring force to the operating member 28 after the operating member 28 is operated.

Figure 14:
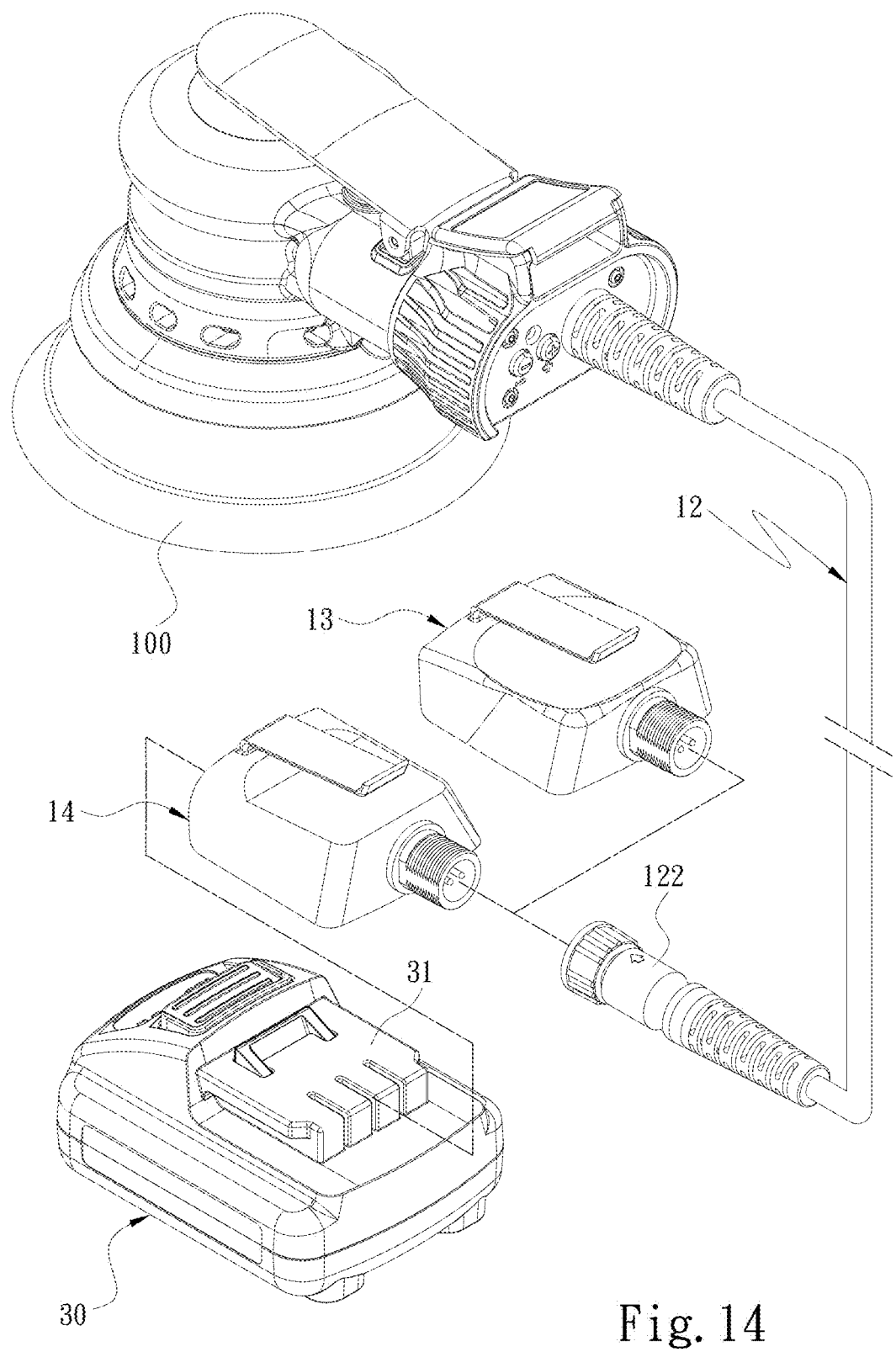
FIG. 14 is a schematic diagram showing that a battery connecting seat of an embodiment of the present invention can be replaced according to different batteries.
Figure 15:
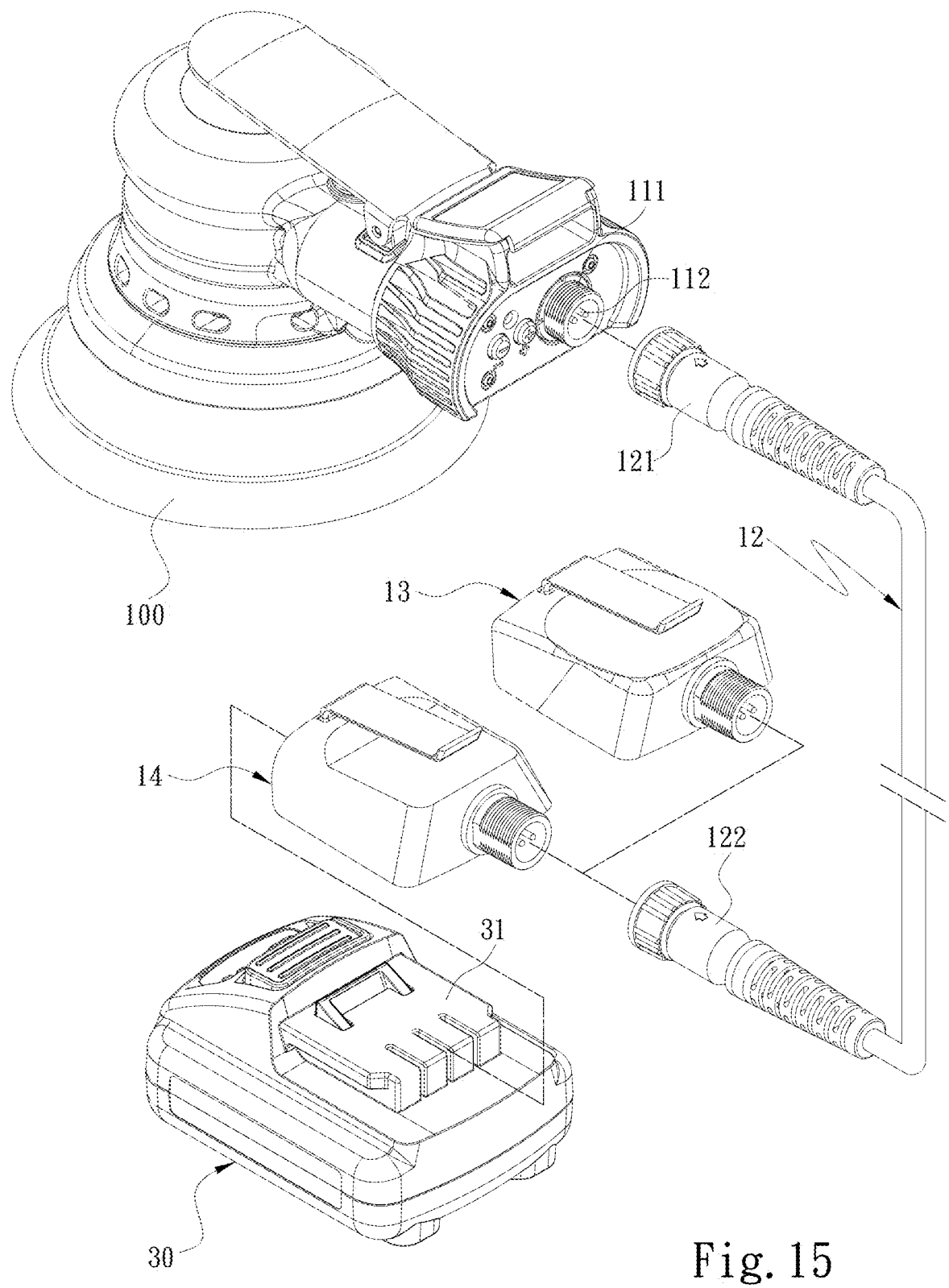
FIG. 15 is a schematic diagram showing that a battery connecting seat of an embodiment of the present invention can be replaced according to different batteries, and a power connecting wire can be separated from an electric grinding machine.

On the other hand, in one embodiment, with reference to FIGS. 4, 14 and 15, the guide chute 131 on the battery socket 13 (or 14) may be formed in accordance with the structure of the boss 21 (or 31). Specifically, the power supply structure of the present invention may vary depending on the structures of the replaceable batteries of various brands. The power supply structure of the invention may further comprise at least one battery socket 14, the structure of the battery socket 14 is different from that of the battery socket 13, the battery socket 13 allows the replaceable battery 20 to be attached thereto, the battery socket 14 allows another replaceable battery 30 to be attached thereto, and the two replaceable batteries 20, 30 being of different structures due to different manufacturers. The two battery sockets 13 and 14 of the present invention can be designed corresponding to the two replaceable batteries 20 and 30, respectively.

What is claimed is:

1. A power supply structure of an electric grinding tool machine comprising:
   a power management module, arranged on a main body of the electric grinding tool machine;
   a power connecting wire, electrically connected with the power management module and extending outside the main body of the electric grinding tool machine; and
   a battery socket, connected with the power connecting wire and being able to be randomly changed in position on a basis of the power connecting wire, the battery socket being used for a replaceable battery which is selectively arranged on the battery socket, and the battery socket being provided with a guide chute formed corresponding to a boss on the replaceable battery in shape and at least two conductive terminals arranged in the guide chute, wherein the battery socket is configured to transmit a power of the replaceable battery to the power management module via the power connecting wire, and the power management module is configured to receive the power to control an operation of the electric grinding tool machine.

2. The power supply structure of an electric grinding tool machine of claim 1, wherein the power management module comprises a first connecting seat arranged on an outer surface of the main body of the electric grinding tool machine, and one end of the power connecting wire which is not connected with the battery socket comprises a first connector capable of being connected with the first connecting seat.

3. The power supply structure of an electric grinding tool machine of claim 2, wherein one end of the power connecting wire which is connected with the battery socket comprises a second connector, and the battery socket is provided with a second connecting seat capable of being connected with the second connector.

4. The power supply structure of an electric grinding tool machine of claim 3, wherein the guide chute has an inlet end and a tail end, the at least two conductive terminals are arranged near the tail end, and the guide chute is further provided with a barrier at the inlet end.

5. The power supply structure of an electric grinding tool machine of claim 4, wherein the battery socket comprises a base for disposing the two conductive terminals, and at least one electric lead connected with the two conductive terminals is arranged in the base.

6. The power supply structure of an electric grinding tool machine of claim 5, wherein the two conductive terminals are horizontally spaced apart, and the two conductive terminals are both plate-shaped.

7. The power supply structure of an electric grinding tool machine of claim 6, wherein a side of the battery socket where the guide chute is not formed comprises a hanging lug.

8. The power supply structure of an electric grinding tool machine of claim 6, wherein a side of the battery socket where the guide chute is not formed comprises a snap ring.

9. The power supply structure of an electric grinding tool machine of claim 7, wherein the battery socket matched for use with the power supply structure is selected on a basis of a shape of the boss of the replaceable battery.

10. The power supply structure of an electric grinding tool machine of claim 8, wherein the battery socket matched for use with the power supply structure is selected on a basis of a shape of the boss of the replaceable battery.

11. The power supply structure of an electric grinding tool machine of claim 1, wherein the battery socket matched for use with the power supply structure is selected on the basis of a shape of the boss of the replaceable battery.

12. The power supply structure of an electric grinding tool machine of claim 1, wherein a side of the battery socket where the guide chute is not formed comprises a hanging lug.

13. The power supply structure of an electric grinding tool machine of claim 10, wherein the two conductive terminals are horizontally spaced apart, and the two conductive terminals are both plate-shaped.

14. The power supply structure of an electric grinding tool machine of claim 1, wherein a side of the battery socket where the guide chute is not formed comprises a snap ring.

15. The power supply structure of an electric grinding tool machine of claim 12, wherein the two conductive terminals are horizontally spaced apart, and the two conductive terminals are both plate-shaped.

16. The power supply structure of an electric grinding tool machine of claim 1, wherein the two conductive terminals are horizontally spaced apart, and the two conductive terminals are both plate-shaped.

\* \* \* \* \*